(12) United States Patent
Nagao et al.

(10) Patent No.: US 9,024,930 B2
(45) Date of Patent: May 5, 2015

(54) PULSE OUTPUT CIRCUIT, SHIFT REGISTER, AND DISPLAY DEVICE

(75) Inventors: Shou Nagao, Kanagawa (JP); Munehiro Azami, Kanagawa (JP); Yoshifumi Tanada, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 792 days.

(21) Appl. No.: 11/968,801

(22) Filed: Jan. 3, 2008

(65) Prior Publication Data

US 2008/0174589 A1 Jul. 24, 2008

Related U.S. Application Data

(62) Division of application No. 11/328,456, filed on Jan. 10, 2006, now Pat. No. 7,394,102, and a division of application No. 10/699,797, filed on Nov. 4, 2003, now Pat. No. 7,151,278, and a division of application No. 10/145,033, filed on May 15, 2002, now Pat. No. 6,928,136.

(30) Foreign Application Priority Data

May 29, 2001 (JP) .................................. 2001-160140

(51) Int. Cl.
*G06F 3/038* (2013.01)
*G09G 5/00* (2006.01)
(Continued)

(52) U.S. Cl.
CPC ............ *H03K 19/096* (2013.01); *G09G 3/3648* (2013.01); *G09G 3/3688* (2013.01);
(Continued)

(58) Field of Classification Search
USPC ............................................................ 345/87
See application file for complete search history.

(56) References Cited

U.S. PATENT DOCUMENTS 3,506,851 A 4/1970 Polkinghorn
3,774,055 A 11/1973 Bapat
(Continued)

FOREIGN PATENT DOCUMENTS

EP 0 315 362 5/1989
EP 0801376 A2 10/1997
(Continued)

OTHER PUBLICATIONS
US 6,646,476, 11/2003, Nagao et al. (withdrawn).
(Continued)

*Primary Examiner* — Amr Awad
*Assistant Examiner* — Andre Matthews
(74) *Attorney, Agent, or Firm* — Fish & Richardson P.C.

(57) ABSTRACT

A circuit is provided which is constituted by TFTs of one conductivity type, and which is capable of outputting signals of a normal amplitude. When an input clock signal CK1 becomes a high level, each of TFTs (101, 103) is turned on to settle at a low level the potential at a signal output section (Out). A pulse is then input to a signal input section (In) and becomes high level. The gate potential of TFT (102) is increased to (VDD−V thN) and the gate is floated. TFT (102) is thus turned on. Then CK1 becomes low level and each of TFTs (101, 103) is turned off. Simultaneously, CK3 becomes high level and the potential at the signal output section is increased. Simultaneously, the potential at the gate of TFT (102) is increased to a level equal to or higher than (VDD+V thN) by the function of capacitor (104), so that the high level appearing at the signal output section (Out) becomes equal to VDD. When SP becomes low level; CK3 becomes low level; and CK1 becomes high level, the potential at the signal output section (Out) becomes low level again.

16 Claims, 17 Drawing Sheets

(51) Int. Cl.
  *G09G 3/36* (2006.01)
  *H03K 19/096* (2006.01)
  *G11C 19/00* (2006.01)
  *G11C 19/28* (2006.01)
  *H03K 19/017* (2006.01)

(52) U.S. Cl.
  CPC ............... *G09G2300/0408* (2013.01); *G09G 2310/0283* (2013.01); *G09G 2310/0297* (2013.01); *G11C 19/00* (2013.01); *G11C 19/28* (2013.01); *H03K 19/01735* (2013.01); *H01L 2924/0002* (2013.01)

(56) References Cited

U.S. PATENT DOCUMENTS

| | | |
|---|---|---|
| 3,898,479 A | 8/1975 | Proebsting |
| 4,090,096 A | 5/1978 | Nagami |
| 4,390,803 A | 6/1983 | Koike |
| 4,412,139 A | 10/1983 | Horninger |
| 4,633,105 A | 12/1986 | Tsujimoto |
| 4,804,870 A | 2/1989 | Mahmud |
| 4,929,911 A | 5/1990 | Davies et al. |
| 4,958,085 A | 9/1990 | Hashimoto et al. |
| 4,959,697 A | 9/1990 | Shier et al. |
| 5,001,359 A | 3/1991 | Hashimoto et al. |
| 5,229,709 A | 7/1993 | Pfennings |
| 5,467,038 A | 11/1995 | Motley et al. |
| 5,517,543 A * | 5/1996 | Schleupen et al. ............ 377/79 |
| 5,548,143 A | 8/1996 | Lee |
| 5,643,826 A | 7/1997 | Ohtani et al. |
| 5,694,061 A * | 12/1997 | Morosawa et al. ........... 326/119 |
| 5,870,071 A | 2/1999 | Kawahata |
| 5,889,291 A | 3/1999 | Koyama et al. |
| 5,949,271 A | 9/1999 | Fujikura |
| 5,949,398 A | 9/1999 | Kim |
| 5,952,991 A | 9/1999 | Akiyama |
| 6,040,810 A | 3/2000 | Nishimura |
| 6,049,228 A | 4/2000 | Moon |
| 6,064,713 A * | 5/2000 | Lebrun et al. ............... 377/67 |
| 6,091,393 A * | 7/2000 | Park ........................... 345/100 |
| 6,384,804 B1 | 5/2002 | Dodabalapur et al. |
| 6,392,628 B1 | 5/2002 | Yamazaki et al. |
| 6,501,098 B2 | 12/2002 | Yamazaki |
| 6,522,323 B1 | 2/2003 | Sasaki et al. |
| 6,542,138 B1 | 4/2003 | Shannon et al. |
| 6,686,899 B2 | 2/2004 | Miyazawa et al. |
| 6,714,183 B2 | 3/2004 | Yamazaki et al. |
| 6,765,552 B2 | 7/2004 | Yamazaki et al. |
| 6,813,332 B2 | 11/2004 | Nagao et al. |
| 6,930,666 B2 | 8/2005 | Miyazawa et al. |
| 6,975,142 B2 | 12/2005 | Azami et al. |
| 7,586,478 B2 | 9/2009 | Azami et al. |
| 7,903,079 B2 | 3/2011 | Azami et al. |
| 2001/0002703 A1 | 6/2001 | Koyama |
| 2001/0011987 A1* | 8/2001 | Kubota et al. ................ 345/98 |
| 2001/0040541 A1* | 11/2001 | Yoneda et al. ................ 345/87 |
| 2001/0045565 A1 | 11/2001 | Yamazaki |
| 2002/0011973 A1 | 1/2002 | Komiya |
| 2002/0044208 A1 | 4/2002 | Yamazaki et al. |
| 2002/0097212 A1 | 7/2002 | Miyazawa et al. |
| 2002/0158666 A1 | 10/2002 | Azami et al. |
| 2002/0167026 A1 | 11/2002 | Azami et al. |
| 2002/0190326 A1 | 12/2002 | Nagao et al. |
| 2003/0011584 A1 | 1/2003 | Azami et al. |
| 2003/0020520 A1 | 1/2003 | Miyake et al. |
| 2003/0034806 A1 | 2/2003 | Azami |
| 2003/0052324 A1 | 3/2003 | Kimura |
| 2003/0111677 A1 | 6/2003 | Miyake |

FOREIGN PATENT DOCUMENTS

| | | |
|---|---|---|
| EP | 1 020 839 | 7/2000 |
| EP | 1 063 630 | 12/2000 |
| EP | 1 139 326 | 10/2001 |
| EP | 1 253 718 A1 | 10/2002 |
| JP | 55-097092 | 7/1980 |
| JP | 55-156427 | 12/1980 |
| JP | 59-016424 | 1/1984 |
| JP | 60-061999 A | 4/1985 |
| JP | 60-140924 | 7/1985 |
| JP | 61007724 A | 1/1986 |
| JP | 63-204815 | 8/1988 |
| JP | 64-044683 | 2/1989 |
| JP | 64-062019 | 3/1989 |
| JP | 01052934 B | 11/1989 |
| JP | 03-165171 | 7/1991 |
| JP | 5224629 A | 9/1993 |
| JP | 05-303354 A | 11/1993 |
| JP | 06-098081 | 4/1994 |
| JP | 09-046216 | 2/1997 |
| JP | 09-186312 | 7/1997 |
| JP | 09-246936 | 9/1997 |
| JP | 10031202 A | 2/1998 |
| JP | 10-112645 | 4/1998 |
| JP | 11-184432 A | 7/1999 |
| JP | 2000-106617 | 4/2000 |
| JP | 2000-150895 A | 5/2000 |
| JP | 2000-259111 | 9/2000 |
| JP | 2001-005426 | 1/2001 |
| JP | 2001-109394 | 4/2001 |
| JP | 2001-133431 | 5/2001 |
| JP | 2001-282169 A | 10/2001 |
| JP | 2002-176162 | 6/2002 |
| JP | 2002-251164 | 9/2002 |
| JP | 2002-251174 | 9/2002 |
| JP | 2002-328643 A | 11/2002 |

OTHER PUBLICATIONS

Invitation to Respond to Written Opinion with Austrailian Search Report and Written Opinion (Singapore Patent Application No. 200202969-2), Jun. 25, 2004, 8 pages.
Munehiro Azarni et al.; U.S. Appl. No. 10/127,600; Office Action dated Oct. 22, 2004.
Chinese Office Action (Application No. 200410069426.9), dated Oct. 19, 2007 with full English translation, 17 pages.
"3.5.1 CMOS Working Principle of a CMOS Inverter," Sep. 1984, p. 89 with full English translation, 5 pages.

* cited by examiner

CK1 : First clock signal
CK2 : Second clock signal
CK3 : Third clock signal
CK4 : Fourth clock signal
SP : Start pulse 101 : First transistor
102 : Second transistor
103 : Third transistor
104 : Capacitor CK1 : First clock signal
CK2 : Second clock signal
CK3 : Third clock signal
CK4 : Fourth clock signal
SP  : Start pulse
LR  : Input change signal
RL  : Inverted input change signal 301 : First transistor
302 : Second transistor
303 : Third transistor
304 : Capacitor
305 : Fourth transistor
306 : Fifth transistor
310 : Input change circuit CK1 : First clock signal
CK2 : Second clock signal
CK3 : Third clock signal
CK4 : Fourth clock signal
SP  : Start pulse 1301 : First transistor
1302 : Second transistor
1303 : Third transistor
1304 : Capacitor

PULSE OUTPUT CIRCUIT, SHIFT REGISTER, AND DISPLAY DEVICE

BACKGROUND OF THE INVENTION

1. Field of the Invention

The present invention relates to a pulse output circuit, a shift register and a display device. Note that in this specification, display devices include a liquid crystal display device using a liquid crystal display element as a pixel, and a self-luminous display device using a self-luminous element, e.g., an electroluminecent (EL) element. Driver circuits for a display device are circuits which perform processing for displaying an image by inputting image signals to pixels arranged in the display device, and which include pulse output circuits, e.g., a shift register and an inverter, and amplifier circuits.

2. Description of the Related Art

In recent years, display devices having a semiconductor thin film formed on an insulating substrate such as a glass substrate, particularly active matrix display devices using thin film transistors (TFTs) have become widely available and have been used in various products. An active matrix display device using TFTs has several hundred thousand to several million pixels arranged in a matrix form and displays an image by controlling charge on each of the pixels by means of a TFT provided in the pixel.

Techniques relating to polysilicon TFTs have recently been developed which comprise forming driver circuits on a substrate on the periphery of a pixel portion by using TFTs simultaneously with the formation of pixel TFTs constituting pixels. Such techniques have contributed to the development of display devices reduced in size and in power consumption. Also, such display devices have become indispensable to display units for mobile information terminals which have found application in an increasing number of application areas in recent years.

Ordinarily, a complementary metal-oxide-semiconductor (CMOS) circuit using a combination of an n-channel TFT and a p-channel TFT is used as a circuit constituting driver circuits for display devices. A shift register will be described as an example of this CMOS circuit with reference to FIGS. 11A, 11B, and 11C. A section in a frame 1100 indicated by a dotted line is a circuit forming one stage for outputting a pulse. Only three of the pulse output stages of the shift register are shown in FIG. 11A. Each circuit forming one stage is constituted by clocked inverters 1101 and 1103, and an inverter 1102. FIG. 11B shows details of the circuit configuration. Referring to FIG. 11B, TFTs 1104 to 1107 constitute a clocked inverter 1101, TFTs 1108 and 1109 constitute a clocked inverter 1102, and TFTs 1110 to 1113 constitute a clocked inverter 1103.

Each of the TFTs constituting the circuit has three electrodes: a gate electrode, a source electrode, and a drain electrode. However, the source region and the drain region cannot be discriminated from each other because of a structural characteristic of the TFT. In ordinary CMOS circuits, one of the source and drain regions of the n-channel TFT at a lower potential is used as a source electrode, while the other at a higher potential is used as a drain electrode. Also, one of the source and drain regions of the p-channel TFT at a higher potential is used as a source electrode, while the other at a lower potential is used as a drain electrode. In the description of the connection of TFTs in this specification, the source and drain electrodes are referred to as a first electrode and a second electrode, respectively, or as a second electrode and a first electrode, respectively, to avoid confusing them one with the other.

The operation of the circuit will be described. In the following description of the operation of TFTs, a conducting state when a channel is formed between impurity regions by application of a potential to the gate electrode is represented by "ON", and a non-conducting state when the impurity region channel is not formed is represented by "OFF".

Referring to FIGS. 11A and 11B and FIG. 11C, which is a timing chart, a clock signal (hereinafter referred to as "CK") and an inverted clock signal (hereinafter referred to as "CKB") are respectively input to the TFTs 1107 and 1104. A start pulse (hereinafter referred to as "SP") is input to the TFTs 1105 and 1106. When CK is high level; CKB is low level; and SP is high level, each of the TFTs 1106 and 1107 is ON and low level is output to be input to the inverter 1102 constituted by the TFTs 1108 and 1109. The inverter 1102 inverts the input low level and outputs high level through an output node (SRout 1). Thereafter, CK becomes low level and CKB becomes high level, while SP is high level. Then, a holding operation by means of a loop formed by the inverter 1102 and the clocked inverter 1103 is performed. Outputting high level through the output node is thus continued. CK and CKB then become high level and low level, respectively, and the clocked inverter 1101 again performs the write operation. Low level is thus output through the output node since SP has already become low level. Subsequently, when CK and CKB become low level and high level, respectively, the holding operation is again performed. Low level output from the output node at this time is held in the loop formed by the inverter 1102 and the clocked inverter 1103.

The operation of one stage is thus performed. In the next stage, the connections with respect to CK and CKB are reversed and the same operation as described above is performed according to the reversed polarity of the clock signal. The same operation is repeated according to the polarity of the clock signal alternately changed. Sampling pulses are thus output successively, as shown in FIG. 11C.

A feature of the CMOS circuit should be mentioned which resides in limiting power consumed by the entire circuit. That is, a current flows only at a moment when a change in logic state (from high level to low level or from low level to high level) occurs and no current flows when a logic state is maintained (although in actuality a small leak current flows).

The demand for display devices using liquid crystals or self-luminous elements is growing rapidly with the development of mobile electronic devices reduced in size and weight. However, it is difficult to effectively reduce the manufacturing cost of such display devices by improving the yield, etc. It is naturally conceivable that the demand will further grow rapidly. Therefore, it is desirable to supply display devices at a reduced cost.

A method of forming an active layer pattern, a wiring pattern, etc., by performing exposure and etching using a plurality of photomasks is ordinarily used as a method of fabricating a driver circuit on an insulator. Since the number of manufacturing steps is a dominant factor in determining the manufacturing cost, a manufacturing method using a reduced number of manufacturing steps is ideal for manufacture of driver circuits. If driver circuits can be formed by using TFTs of only one of two conductivity types, i.e., the n-channel or p-channel type, instead of being formed of CMOS circuits, part of the ion doping process can be removed and the number of photomasks can be reduced.

FIG. 9A illustrates a CMOS inverter (I) ordinarily used, and inverters (II) and (III) formed by using only TFTs of one polarity or by using only one TFT. The inverter (II) has a TFT used as a load. The inverter (III) has a resistor used as a load. The operation of each inverter will be described.

FIG. 9B shows the waveform of a signal input to each inverter. The input signal amplitude is low level/high level=VSS/VDD (VSS<VDD). It is assumed that VSS=0 V.

The operation of the circuit will be described. To describe the operation simply and explicitly, it is assumed here that the threshold voltages of n-channel TFTs are equal to each other and are represented by V thN across the board, and that, similarly, the threshold voltage of a p-channel TFT is represented by a constant value V thP.

When a signal such as shown in FIG. 9B is input to the CMOS inverter, and when the potential of the input signal is high level, the p-channel TFT 901 is OFF and the N-channel TFT 902 is ON. The resulting potential at the output node is low level. Conversely, when the potential of the input signal is low level, the p-channel TFT 901 is ON and the N-channel TFT 902 is OFF. The resulting potential at the output node is high level (FIG. 9C).

The operation of the inverter (II) using a TFT as a load will next be described with respect to a case where a signal such as shown in FIG. 9B is input. When the input signal is low level, the n-channel TFT 904 is OFF. The load TFT 903 is operating in a saturated state. As a result, the potential at the output node is pulled up toward a high level. On the other hand, when the input signal is high level, the n-channel TFT 904 is ON. The potential at the output node is pulled down toward a low level if the current capacity of the n-channel TFT 904 is sufficiently larger than the current capacity of the load TFT 903.

In the inverter (III) using a resistor as a load, the ON resistance of the n-channel TFT 906 is set to a value sufficiently smaller than the resistance value of a load resistor 905. In this inverter, therefore, when the input signal is high level, the n-channel TFT 906 is ON and the potential at the output node is pulled down toward a low level. When the input signal is low level, the n-channel TFT 906 is OFF and the potential at the output node is pulled down toward a high level.

However, there is a problem described below with each of the inverter using a TFT as a load and the inverter using a resistor as a load. FIG. 9D shows the waveform of the output from the inverter using the TFT 903 as a load. When the output is high level, the potential of the output is lower than VDD by an amount indicated by 907. If in the load TFT 903 the terminal on the output node side is a source while the terminal on the power supply VDD side is a drain, the potential at the gate electrode is VDD, since the gate electrode and the drain region are connected to each other. The condition for maintaining the load TFT in the ON state is (TFT 903 gate-source voltage>V thN). Therefore the highest level to which the potential at the output node can be increased is (VDD−V thN). That is, the amount 907 is equal to V thN. Further, when the output is low level, the potential of the output is higher than VSS by an amount indicated by 908, depending on the ratio of the current capacities of the load TFT 903 and the n-channel TFT 904. To bring the output potential sufficiently close to VSS, it is necessary to sufficiently increase the current capacity of the n-channel TFT 904 relative to that of the load TFT 903. Similarly, referring to FIG. 9E showing the waveform of the output from the inverter using the resistor 905 as a load, the potential of the output is higher by an amount indicated by 909, depending on the ratio of the resistance value of the load resistor 905 and the ON resistance of the n-channel TFT 906. That is, in use of the above-described inverter formed by using only one TFT or only TFTs of one polarity, the amplitude of the output signal is attenuated relative to the amplitude of the input signal.

SUMMARY OF THE INVENTION

In view of the above-described problem, an object of the present invention is to provide a pulse output circuit which is formed by using only TFTs of one polarity, which can therefore be fabricated at a low cost by performing a reduced number of manufacturing steps, and from which an output can be obtained without being attenuated in amplitude, and a shift register using the output circuit.

Conditions for ensuring that the amplitude of the output signal has a normal value of low level/high level=VSS/VDD in the inverter shown in (II) of FIG. 9A as an inverter using a TFT as a load will be discussed. First, in a circuit such as shown in FIG. 10A, when the output signal potential becomes low level, a state in which the resistance between power supply VSS and output node (Out) is sufficiently small relative to the resistance between power supply VDD and output node (Out) suffices for bringing the potential of the output signal sufficiently close to VSS. That is, maintaining an n-channel TFT 1001 in the OFF state during the time period when an n-channel TFT 1002 is ON suffices.

Secondly when the output signal potential becomes high level, a state in which the absolute value of the gate-source voltage of the n-channel TFT 1002 is always higher than V thN and the TFT 1001 is reliably maintained in the OFF state suffices for making the potential of the output signal equal to VDD. That is, to meet a condition for making the high level of the output node equal to VDD, it is necessary to increase the potential at the gate electrode of the n-channel TFT 1001 to a level higher than (VDD+V thN).

According to the present invention, therefore, the following measure is adopted. A capacitor 1003 is provided between the gate and the source of an n-channel TFT 1001, as shown in FIG. 10B. When the n-channel TFT 1001 has a potential at the gate electrode such as to be in a floating state, the potential at the output node is increased. With the increase in the potential at the output node, the potential at the gate electrode of the n-channel TFT 1001 is increased by the function of capacitive coupling through the capacitor 1003. By using this effect, it is possible to increase the potential at the gate electrode of the n-channel TFT 1001 to a level higher than VDD (more accurately, higher than (VDD+V thN)). Thus, it is possible to pull up the potential at the output node sufficiently close to VDD.

A capacitor produced as a parasitic capacitance between the gate and the source of the TFT 1001 may be used as the capacitor 1003 shown in FIG. 10B, or a capacitor portion may be actually fabricated. If a capacitor portion is independently fabricated, a simple manufacturing process is preferably used in which two of an active layer material, a gate material and a wiring material are used and an insulating layer is interposed between them. However, a capacitor portion may be fabricated by using other materials. In a case where an active layer is used, it is desirable to reduce the resistance of the active layer, for example, by adding an impurity to the material of the active layer.

Described hereinafter is the structure of the present invention.

A pulse output circuit according to the present invention comprises first to third transistors, first to third signal input sections, a signal output section, and a power supply, and the pulse output circuit is characterized in that:

the first to third transistors are of the same conductivity type;

a gate electrode of the first transistor is electrically connected to the first signal input section;

a first electrode of the first transistor is electrically connected to the second signal input section;

a second electrode of the first transistor is electrically connected to a gate electrode of the second transistor;

a first electrode of the second transistor is electrically connected to the third signal input section;

a second electrode of the second transistor is electrically connected to the signal output section;

a gate electrode of the third transistor is electrically connected to the first signal input section;

a first electrode of the third transistor is electrically connected to the power supply; and a second electrode of the third transistor is electrically connected to the signal output section.

A pulse output circuit according to the present invention comprises first to third transistors, first to fourth signal input sections, a signal output section, a power supply, and an input change circuit, and the pulse output circuit is characterized in that:

the first to third transistors are of the same conductivity type;

a gate electrode of the first transistor is electrically connected to the first signal input section;

a first electrode of the first transistor is electrically connected to the input change circuit;

the input change circuit is electrically connected to the second signal input section and to the third signal input section;

a second electrode of the first transistor is electrically connected to a gate electrode of the second transistor;

a first electrode of the second transistor is electrically connected to the fourth signal input section;

a second electrode of the second transistor is electrically connected to the signal output section;

a gate electrode of the third transistor is electrically connected to the first signal input section;

a first electrode of the third transistor is electrically connected to the power supply; and a second electrode of the third transistor is electrically connected to the signal output section.

A pulse output circuit according to the present invention comprises first to third transistors, first to fourth signal input sections, a signal output section, a power supply, and an input change circuit, and the pulse output circuit is characterized in that:

the first to third transistors are of the same conductivity type:

a gate electrode of the first transistor is electrically connected to the first signal input section;

a first electrode of the first transistor is electrically connected to the input change circuit;

the input change circuit is electrically connected to the second signal input section and to the third signal input section;

a second electrode of the first transistor is electrically connected to a gate electrode of the second transistor;

a first electrode of the second transistor is electrically connected to the fourth signal input section;

a second electrode of the second transistor is electrically connected to the signal output section;

a gate electrode of the third transistor is electrically connected to the first signal input section;

a first electrode of the third transistor is electrically connected to the power supply;

a second electrode of the third transistor is electrically connected to the signal output section;

when the input change circuit is in a first state, conduction is provided between the first electrode of the first transistor and the second signal input section and no conduction is provided between the first electrode of the first transistor and the third signal input section; and when the input change circuit is in a second state, conduction is provided between the first electrode of the first transistor and the third signal input section and no conduction is provided between the first electrode of the first transistor and the second signal input section.

A pulse output circuit according to the present invention, characterized in that the input change circuit has a fourth transistor, a fifth transistor, a fifth signal input section, and a sixth signal input section;

each of the fourth transistor and the fifth transistor is of the same conductivity type as the first to third transistors;

a gate electrode of the fourth transistor is electrically connected to the fifth signal input section;

a first electrode of the fourth transistor is electrically connected to the second signal input section;

a second electrode of the fourth transistor is electrically connected to the first electrode of the first transistor;

a gate electrode of the fifth transistor is electrically connected to the sixth signal input section;

a first electrode of the fifth transistor is electrically connected to the third signal input section;

a second electrode of the fifth transistor is electrically connected to the first electrode of the first transistor;

when an input change signal is input to the fifth signal input section and an inverted input change signal is input to the sixth signal input section, the fourth transistor is set in a conducting state and the fifth transistor is set in a nonconducting state; and when the polarity of the input change signal is reversed and the polarity of the inverted input change signal is reversed, the fourth transistor is set in a nonconducting state and the fifth transistor is set in a conducting state.

A pulse output circuit according to the present invention further comprises capacitor means between the gate electrode and the first electrode of the second transistor or between the gate electrode and the second electrode of the second transistor.

According to a pulse output circuit of the present invention, the capacitor means may be formed between the gate electrode of the second transistor and an active layer of the second transistor, or between any two of an active layer material, a material forming the gate electrode, and a wiring material.

Employing a pulse output circuit of the present invention, there is provided a shift register in which sampling pulses are successively output on the basis of first to fourth clock signals and a start pulse.

A shift register according to the present invention is characterized in that:

the shift register comprises first to fourth clock signal lines and a start pulse input line;

in the pulse output circuit forming the (4n−3)th stage (n: a natural number, 1≤n), the first signal input section is electrically connected to the first clock signal line;

the second signal input section is electrically connected to the start pulse input line if n=1, or to the signal output section of the pulse output circuit forming the (4n−1)th stage if n≠1;

the third signal input section is electrically connected to the third clock signal line;

in the pulse output circuit forming the (4n−2)th stage, the first signal input section is electrically connected to the second clock signal line;

the second signal input section is electrically connected to the signal output section of the pulse output circuit forming the (4n−3)th stage;

the third signal input section is electrically connected to the fourth clock signal line;

in the pulse output circuit forming the (4n−1) th stage, the first signal input section is electrically connected to the third clock signal line;

the second signal input section is electrically connected to the signal output section of the pulse output circuit forming the (4n−2) th stage;

the third signal input section is electrically connected to the first clock signal line;

in the pulse output circuit forming the 4n th stage, the first signal input section is electrically connected to the fourth clock signal line;

the second signal input section is electrically connected to the signal output section of the pulse output circuit forming the (4n−1) th stage;

the third signal input section is electrically connected to the second clock signal line; and sampling pulses are successively output on the basis of first to fourth clock signals and a start pulse.

A shift register according to the present invention is characterized in that:

the shift register comprises first to fourth clock signal lines and a start pulse input line;

in the pulse output circuit forming the (4n−3) th stage (n: a natural number, 1≤n), the first signal input section is electrically connected to the first clock signal line;

the second signal input section is electrically connected to the start pulse input line if n=1, or to the signal output section of the pulse output circuit forming the (4n−1) th stage if n≠1;

the third signal input section is electrically connected to one of the start pulse input line and the signal output section of the pulse output circuit forming the (4n−2) th stage; and the fourth signal input section is electrically connected to the third clock signal line, in the pulse output circuit forming the (4n−2) th stage, the first signal input section is electrically connected to the second clock signal line;

the second signal input section is electrically connected to the signal output section of the pulse output circuit forming the (4n−3) th stage;

the third signal input section is electrically connected to one of the start pulse input line and the signal output section of the pulse output circuit forming the (4n−1) th stage; and the fourth signal input section is electrically connected to the fourth clock signal line, in the pulse output circuit forming the (4n−1) th stage, the first signal input section is electrically connected to the third clock signal line;

the second signal input section is electrically connected to the signal output section of the pulse output circuit forming the (4n−2) th stage;

the third signal input section is electrically connected to one of the start pulse input line and the signal output section of the pulse output circuit forming the 4n th stage; and the fourth signal input section is electrically connected to the first clock signal line, in the pulse output circuit forming the 4n th stage, the first signal input section is electrically connected to the fourth clock signal line;

the second signal input section is electrically connected to the signal output section of the pulse output circuit forming the (4n−1) th stage;

the third signal input section is electrically connected to one of the start pulse input line and the signal output section of the pulse output circuit forming the (4n+1) th stage; and the fourth signal input section is electrically connected to the second clock signal line, and sampling pulses are successively output on the basis of first to fourth clock signals and a start pulse.

A pulse output circuit according to the present invention may be constituted only of a transistor whose conductivity type is an n-channel type, or only of a transistor whose conductivity type is a p-channel type.

A shift register according to the present invention may be constituted only of a transistor whose conductivity type is an n-channel type, or only of a transistor whose conductivity type is a p-channel type.

DESCRIPTION OF THE PREFERRED EMBODIMENTS

Figure 1A:
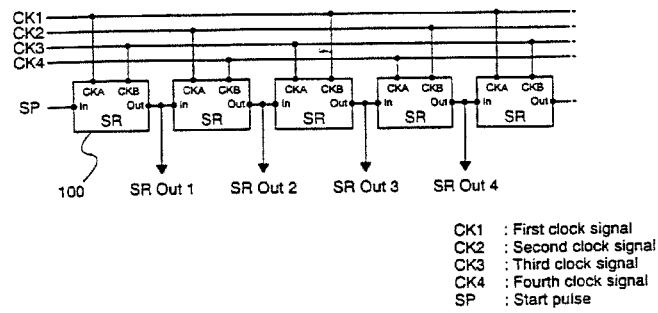
FIGS. 1A and 1B are diagrams showing a shift register formed by using a pulse output circuit in accordance with the present invention.

FIG. 1A schematically shows a shift register in accordance with the present invention. A block 100 in the block diagram of FIG. 1A represents a pulse output circuit which forms one stage for outputting a sampling pulse. The same pulse output circuits are successively connected to form a plurality of stages constituting the shift register shown in FIG. 1A. The shift register shown in FIG. 1A has first to fourth clock signal lines and a start pulse input line. First to fourth clock signals (CK1 to CK4) are respectively input from the first to fourth clock signal lines, and a start pulse (SP) is input from the start pulse input line.

Figure 1B:
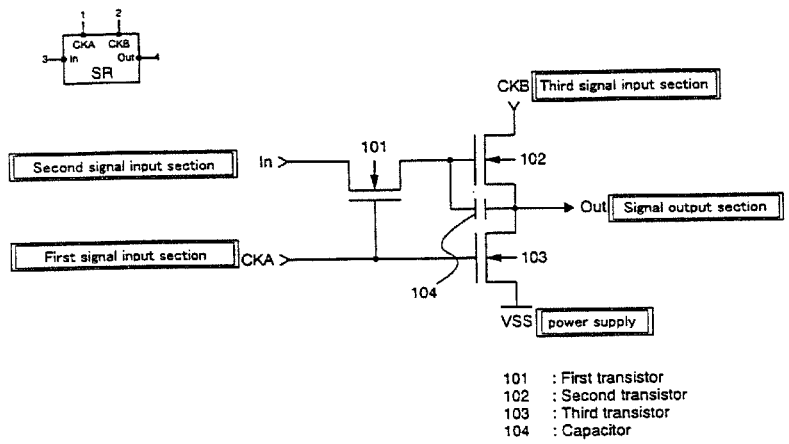

FIG. 1B shows the detailed circuit structure of the block 100. A gate electrode of a TFT 101 and a gate electrode of a TFT 103 are connected to a first signal input section (CKA). The TFT 101 has an input electrode connected to a second signal input section (In) and has an output electrode connected to the gate electrode of the TFT 102 and to one end of an electrode of a capacitor 104. The TFT 102 has an input electrode connected to a third signal input section (CKB). An output electrode of the TFT 102, an output electrode of the TFT 103 and the other end of the capacitor 104 are connected to a signal output section (Out). An input electrode of the TFT 103 is connected to a low-potential power supply (VSS).

While the circuit in this embodiment mode of the present invention is formed by using only n-channel TFTs, a similar circuit may be formed by using only p-channel TFTs.

The clock signal input to the first signal input section (CKA) and the clock signal input to the third signal input section (CKB) are opposite in polarity to each other. The second clock signal has a phase delay of ¼ period from the first clock signal, and the third clock signal further has a phase delay of ¼ period from the second clock signal. Further, the fourth clock signal has a phase delay of ¼ period from the third clock signal. That is, the third clock signal has a phase delay of ½ period from the first clock signal and is equal to a signal obtained by reversing the polarity of the first clock signal. Similarly, the fourth clock signal has a phase delay of ½ period from the second clock signal and is equal to a signal obtained by reversing the polarity of the second clock signal.

In the shift register using pulse output circuits each of which is formed as shown in FIG. 1B, and which are successively connected to form a plurality of stages, an output pulse from one stage is input to the second signal input section (In) in the subsequent stage. In the first stage, a start pulse is input to the second signal input section (In).

Referring to Table 1, in the (4n−3) th stage (n: a natural number, 1≤n), the first clock signal is input to the first signal input section (CKA) and the third clock signal is input to the third signal input section (CKB). In the (4n−2) th stage (n: a natural number, 1≤n), the second clock signal is input to the first signal input section (CKA) and the fourth clock signal is input to the third signal input section (CKB). In the (4n−1) th stage, the third clock signal is input to the first signal input section (CKA) and the first clock signal is input to the third signal input section (CKB). In the 4n th stage, the fourth clock signal is input to the first signal input section (CKA) and the first clock signal is input to the third signal input section (CKB).

TABLE 1

|  | Signal input portion (CKA) | Signal input portion (CKB) |
|---|---|---|
| 4(n − 1) th stage | Fourth clock signal | Second clock signal |
| 4n − 3 th stage | First clock signal | Third clock signal |
| 4n − 2 th stage | Second clock signal | Fourth clock signal |
| 4n − 1 th stage | Third clock signal | First clock signal |
| 4n th stage | Fourth clock signal | Second clock signal |
| ... | ... | ... |

That is, the shift register in this embodiment mode of the invention has a certain number of constitutional units each formed of a portion including the pulse output circuits in four consecutive stages. Even if the number of stages in which the pulse output circuits are connected is smaller than four, the clock signals are input in the order in accordance with Table 1.

Figure 2:
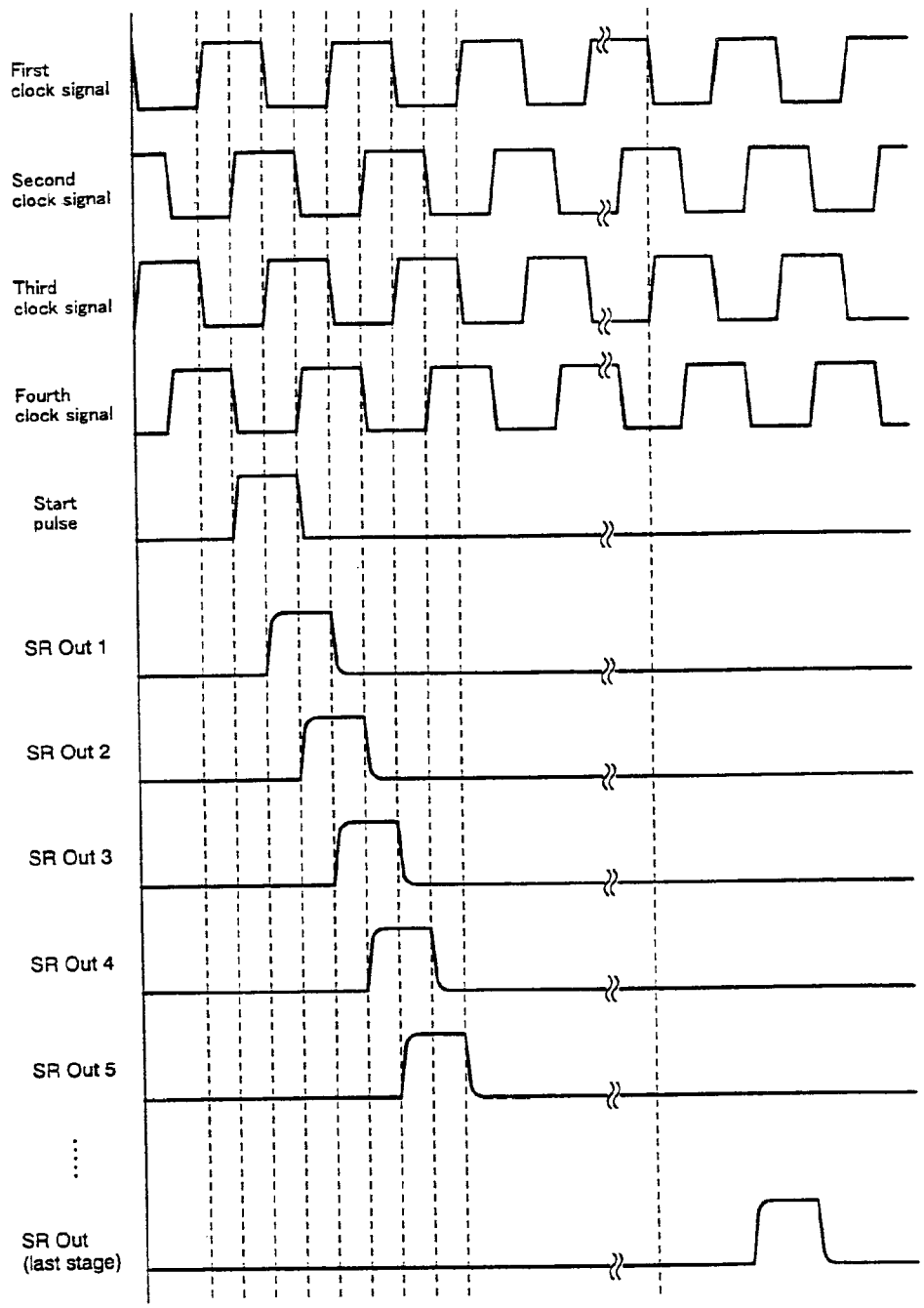
FIG. 2 is a timing chart relating to drive of the shift register shown in FIGS. 1A and 1B.

The operation of the circuits will be described with reference to the timing chart of FIG. 2. The description will be made by assuming that the voltage amplitude of the clock signals and the start pulse is low level/high level=VSS/VDD, and that VSS<VDD.

<1> In the first-stage pulse output circuit, the first clock signal (CK1) is supplied to the gate electrodes of the TFTs 101 and 103 and becomes high level to turn on the TFTs 101 and 103. At this stage, since no start pulse (SP) has been input, the potential at the gate electrode of the TFT 102 is low level and the potential at the signal output section (Out) is settled at low level.

<2> When a start pulse (SP) input from the signal input section (In) thereafter becomes high level, the potential at the gate electrode of the TFT 102 is increased to (VDD−V thN) to be thereafter maintained in a floating state. The TFT 102 is thus turned on. At this point, however, the third clock signal (CK3) input to the signal input section (CKB) is low level and the potential at the signal output section (Out) is not changed.

<3> Subsequently, the first clock signal (CK1) becomes low level to turn off the TFTs 101 and 103. Simultaneously, the third clock signal (CK3) becomes high level. Since the TFT 102 has already been turned on, the potential at the signal output section (Out) is increased. The potential at the gate electrode of the TFT 102, which is maintained in the floating state at (VDD−V thN) since the TFT 101 has been turned on, is further increased from (VDD−V thN) to a level higher than (VDD+V thN) by the function of the capacitor 104, as the potential at the signal output section (Out) is increased. Therefore, when the potential at the signal output section (Out) becomes high level, it is equal to VDD.

<4> The start pulse (SP) then becomes low level. Subsequently, when the first clock signal (CK1) again becomes high level, the TFTs 101 and 103 are turned on, the potential at the gate electrode of the TFT 102 becomes low level, and the TFT 102 is thus turned off. Because the TFT 103 is turned on, the potential at the signal output section (Out) becomes low level.

The circuits in the first to final stages successively operate as described above to output sampling pulses. The shift register formed by using the pulse output circuit of the present invention is formed only of TFTs of one conductivity type but can output pulses of a normal amplitude by avoiding attenuation of the amplitude of the output pulses due to the threshold value of the TFTs. Even during the period during which no sampling pulse is output from each stage, the TFT 103 is turned on each time the clock signal input from the signal input section (CKA) becomes high level, thereby settling the signal output section (Out) potential at low level. The signal output section is not floated for a long time. Therefore, the shift register can be used in a circuit of a comparatively low driving frequency, e.g., a gate signal line driver circuit.

Embodiments of the present invention will be described below.

Embodiment 1

Figure 3A:
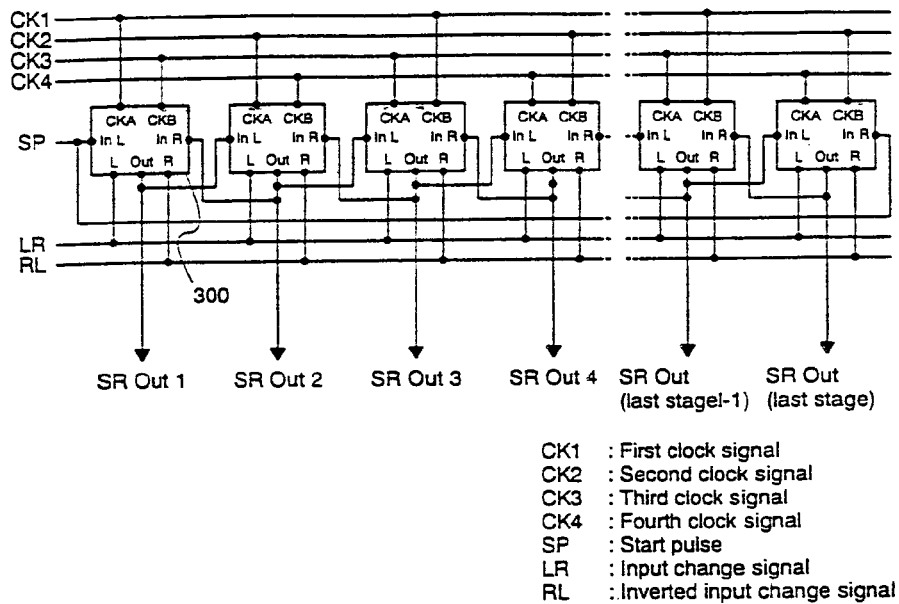
FIGS. 3A and 3B are diagrams showing a shift register to which a scanning direction changing function is added, and which represents an embodiment of the present invention.

FIG. 3A shows an example of a shift register arranged in such a manner that a scanning direction inverting function is added to the shift register described above in the description of the embodiment mode of the present invention. The shift register of this embodiment uses additional input signals: an input change signal (LR) and an inverted input change signal (RL) other than those used in the circuit shown in FIG. 1A.

Figure 3B:
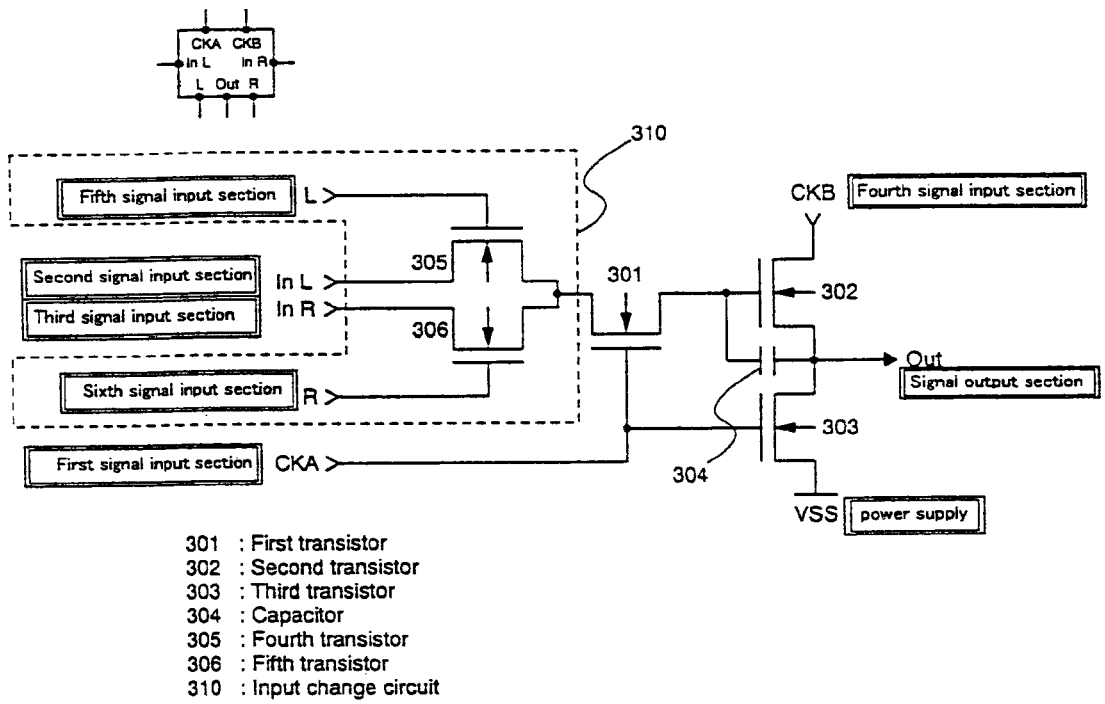

FIG. 3B shows details of the configuration of the pulse output circuit corresponding to one stage represented by a block 300 in FIG. 3A. The portion of the pulse output circuit constituted by TFTs 301 to 303 and a capacitor 304 is the same as the circuit shown in FIG. 1B, and the pulse output circuit of this embodiment has an input change circuit 310 constituted by a switch formed of TFTs 305 and 306, a fifth signal input section, and a sixth signal input section.

Each of output electrodes of TFTs 305 and 306 is connected to an input electrode of TFT 301. TFT 305 has an input electrode connected to a second signal input section (InL) and has a gate electrode electrically connected to the fifth signal input section (L). TFT 306 has an input electrode connected to a third signal input section (InR) and has a gate electrode electrically connected to the sixth signal input section (R). Input change signal (LR) is input to the fifth signal input section (L), while inverted input change signal (RL) is input to the sixth signal input section (R). Each of LR and RL exclusively has a high level or a low level in relation to each other. Correspondingly, the input change circuit 310 in this embodiment changes between two states described below.

Firstly, when LR and RL are high level and low level, respectively, TFT 305 is turned on and TFT 306 is turned off. A sampling pulse supplied from the preceding stage through the second signal input section (InL) is thus applied to the input electrode of TFT 301. Secondly, when LR and RL are low level and high level, respectively, TFT 305 is turned off and TFT 306 is turned on. A sampling pulse supplied from the preceding stage through the third signal input section (InR) is thus applied to the input electrode of TFT 301.

In the shift register shown in FIG. 3A, sampling pulses are output in the order of the first stage, the second stage, . . . , and the final stage when LR and RL are high level and low level, respectively, and sampling pulses are output in the order of the final stage, . . . , the second stage, and the first stage when LR and RL are low level and high level, respectively.

Figure 4:
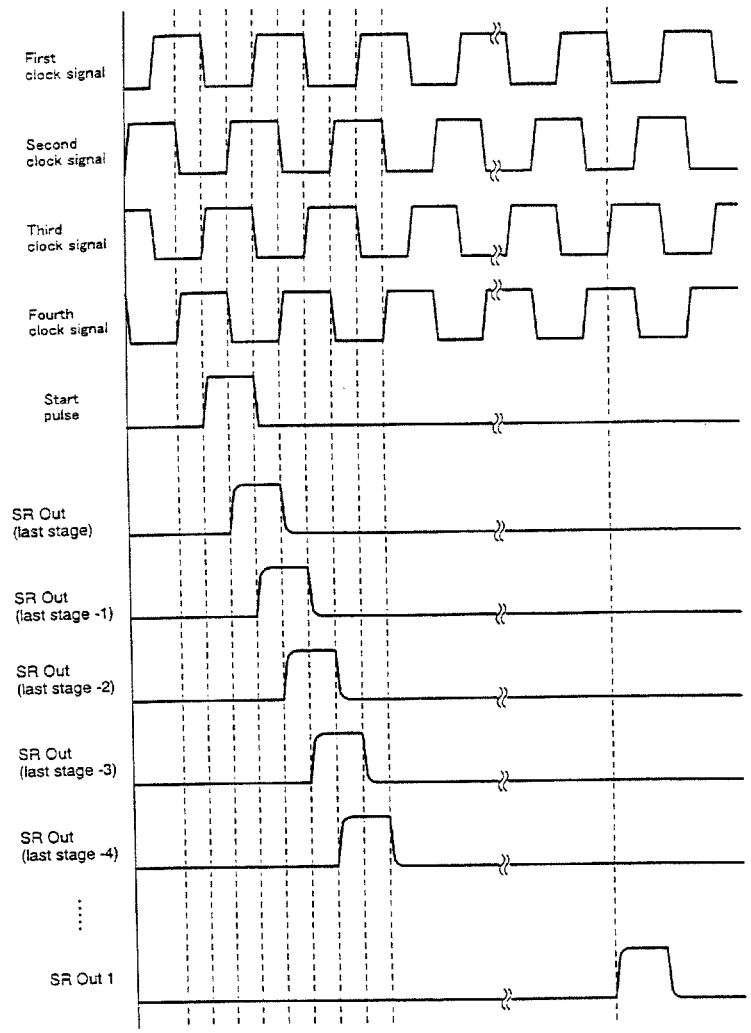
FIG. 4 is a timing chart relating to drive of the shift register shown in FIGS. 3A and 3B.

To change the scanning direction, it is necessary to change timing of inputting of the clock signals. The timing shown in the timing chart of FIG. 2 is for scanning in the normal direction. The timing chart of FIG. 4 shows timing for scanning in the reverse direction. The clock signals are input in the order reverse to that shown in FIG. 2. That is, the third clock signal is input with a ¼ period delay from the fourth clock signal, the second clock signal is input with a ¼ period delay from the third clock signal, and the first clock signal is input with a ¼ delay from the second clock signal. The start pulse input timing is determined depending upon the number of stages formed by the pulse output circuits used in the shift register, i.e., which clock signal the pulse output circuit to first output a sampling pulse is driven with. In the example of the timing shown in FIG. 4, the fourth clock signal is input to the signal input section (CKA) of the end pulse output circuit, and the second clock signal is input to the signal input section (CKB).

Embodiment 2

An example of a display device fabricated by using only TFTs of one polarity will be described.

Figure 12:
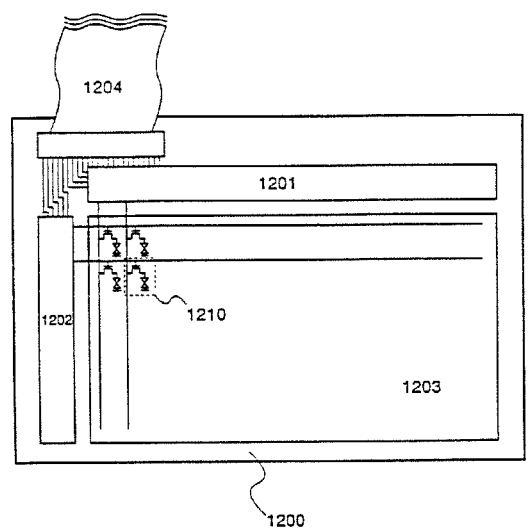
FIG. 12 is a diagram showing the entire appearance of the display device provided in accordance with the present invention.

FIG. 12 is a diagram schematically showing the entire display device. A source signal line driver circuit 1201, a gate signal line driver circuit 1202, and a pixel portion 1203 are formed integrally with each other on a substrate 1200. A section of the pixel portion 1203 shown in a frame 1210 indicated by the dotted line is a segment for forming one pixel. The example of the pixel shown in FIG. 12 is a pixel of a liquid crystal display device. ON/OFF control of each pixel is performed by using one TFT in the pixel (hereinafter referred to as "pixel TFT") when charge is applied to one electrode of the liquid crystal device. Signals (clock signals, a start pulse, etc.) for driving the source signal line driver circuit 1201 and the gate signal line driver circuit 1202 are externally supplied via a flexible printed circuit (FPC) 1204.

The substrate having the pixel TFT and the driver circuits may be manufactured in accordance with a known method, for example, as disclosed in U.S. Pat. No. 5,889,291 issued to Koyama et al. Also, it is possible to crystallize a semiconductor film for an active layer of the TFTs by utilizing a metal element for promoting crystallization although other known methods can be used for crystallization. Such a method of using the metal element is disclosed, for example, in U.S. Pat. No. 5,643,826 issued to Ohtani et al. The entire disclosures of these U.S. Pat. Nos. 5,889,291 and 5,643,826 are incorporated herein by reference.

Figure 5:
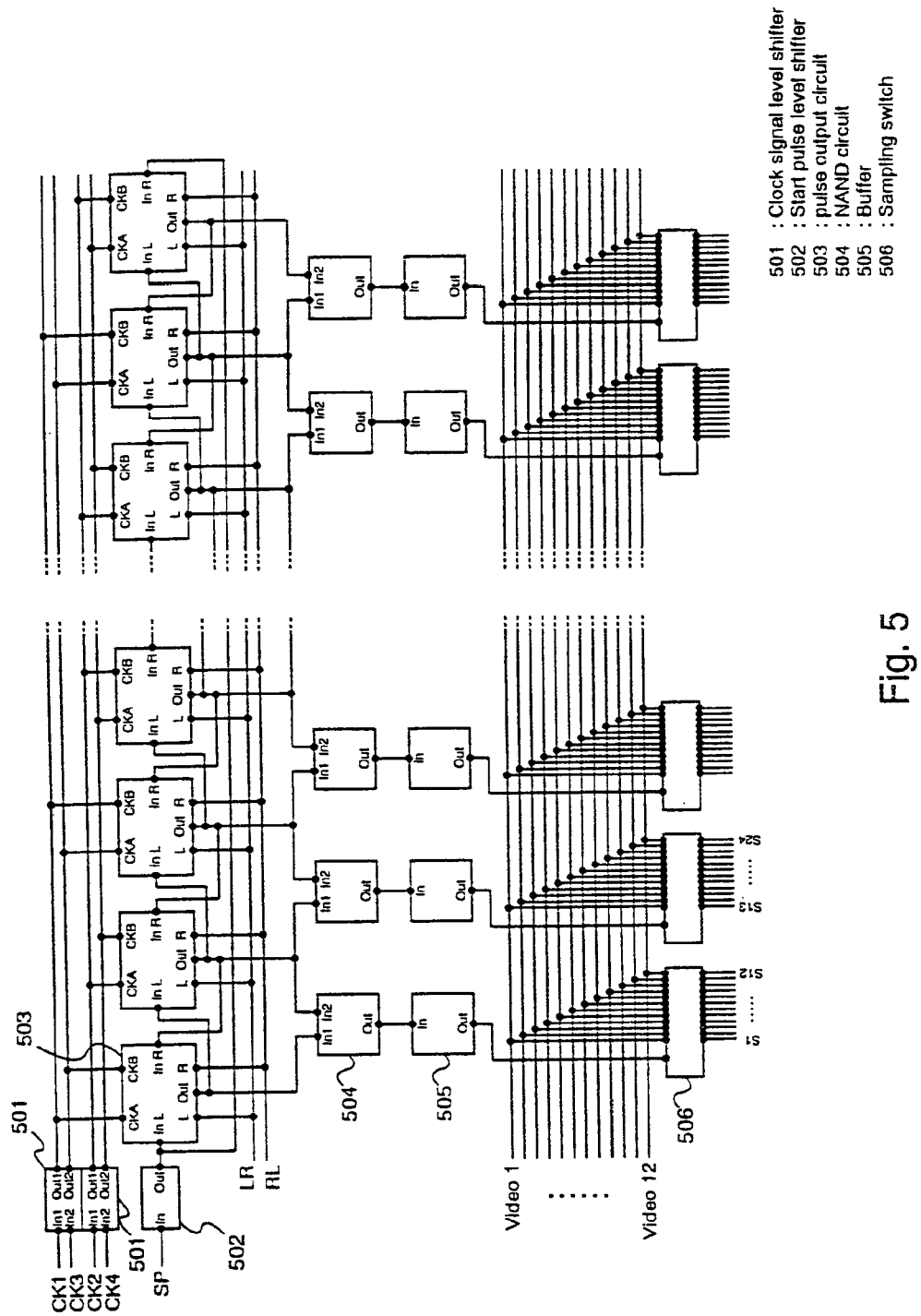
FIG. 5 is a diagram showing a structure of a source signal line driver circuit in a display device provided in accordance with the present invention.

FIG. 5 is a diagram showing the entire structure of the source signal line driver circuit 1201 in the display device shown in FIG. 12. The source signal line driver circuit has a clock signal level shifter 501, a start pulse level shifter 502, a pulse output circuits 503 constituting a shift register, a NAND circuit 504, a buffer 505, and a sampling switch 506. The signals externally supplied are first to fourth clock signals (CK1 to CK4), a start pulse (SP), an input change signal (LR), an inverted input change signal (RL), and analog video signals (Video 1 to Video 12). The first to fourth clock signals (CK1 to CK4) and the start pulse (SP) undergo amplitude conversion in the level shifter immediately after being externally supplied as low-voltage amplitude signals. These signals are thus converted into high-voltage amplitude signals to be input to the driver circuit. In the source signal line driver circuit in the display device of this embodiment, analog signals corresponding to twelve source signal lines are simultaneously sampled by driving the sampling switch 506 by means of a sampling pulse output from the pulse output circuit forming one stage in the shift register.

Figure 6A:
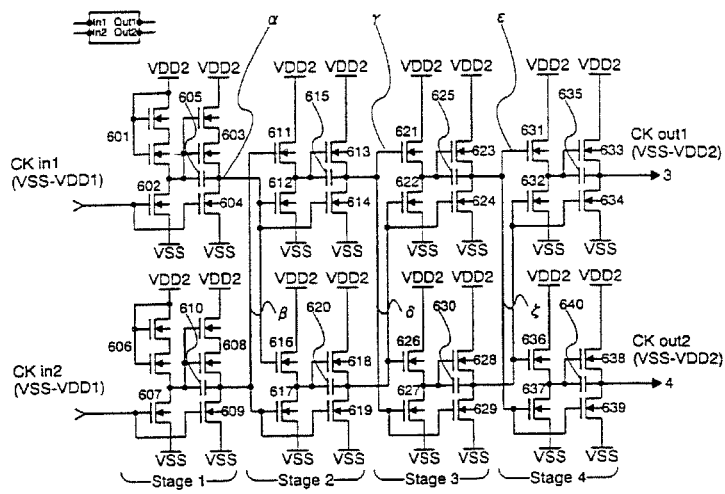
FIGS. 6A, 6B, 6C, and 6D are diagrams showing details of a circuit structure of a level shifter in the display device provided in accordance with the present invention.

FIG. 6A shows the structure of the clock signal level shifter 501. In the clock signal level shifter 501, clock signals opposite in polarity to each other are paired (CK1 and CK3, or CK2 and CK4) and undergo amplitude conversion in a pair of one-input-type level shifters arranged parallel to each other (in Stage 1), and outputs from the level shifter circuits are used as inverted inputs to following buffer stages (Stage 2, Stage 3, Stage 4).

The operation of the circuit shown in FIG. 6A will be described. Three power supply potentials VSS, VDD1, and VDD2 are used. These potentials are in a relationship: VSS<VDD1<VDD2. In this embodiment, VSS=0[V], VDD1=5[V], and VDD2=16[V]. Each of TFTs 601, 603, 606, and 608 shown in FIG. 6A is of a double gate structure. However, these TFTs may alternatively be provided in a single gate structure or in a multigate structure having three or more gate electrodes. The number of gates is not particularly limited with respect to the other TFTs.

First clock signal (CK1) having an amplitude of a low level/high level=VSS/VDD1 is input from a signal input section (CK in1). When CK1 is high level, each of TFTs 602 and 604 is ON, the potential at the gate electrode of TFT 603 is low level, and TFT 603 is OFF. The ON resistance of TFT 602 is set to a sufficiently small value relative to that of TFT 601 in the design stage. Therefore, a low level appears at node α.

When CK1 is low level, each of TFTs 602 and 604 is OFF, so that the potential at the gate electrode of TFT 603 is pulled up toward VDD2 through TFT 601 operating in a saturated state. When the potential becomes equal to (VDD2−V thN), TFT 601 is turned off and the gate electrode of TFT 603 is floated. TFT 603 is thus turned on and the potential at node α is pulled up toward VDD2. With the increase in the potential at node α, the potential at the gate electrode of TFT 603 in the floating state is pulled up by the function of capacitor 605 to a level higher than VDD2. The potential at the gate electrode of TFT 603 is thus set above (VDD2+V thN), so that the high level appearing at node α becomes equal to VDD2. As a result, the low level of an output signal becomes equal to VSS and the high level of the output signal becomes equal to VDD2, thus completing amplitude conversion.

On the other hand, third clock signal (CK3) also having the amplitude VSS–VDD1 is input from a signal input section (CK in2). The one-input-type level shifter constituted by TFTs 606 to 609 and capacitor 610 operates in the same manner as that described above to perform amplitude conversion, thereby outputting through node β a signal having an amplitude of VSS–VDD2. The signal appearing at node α has the polarity opposite to that of the input CK1, and the signal appearing at node β has the polarity opposite to that of the input CK3.

In the level shifter used in the display device of this embodiment, buffer stages (Stages 2 to 4) are provided as stages following the level shifter circuits (Stage 1) in consideration for the load with respect to the amplitude-converted pulse. The inverter circuit forming each buffer stage is of a two input type requiring an input signal and an inverted signal of the input signal. The two-input-type inverter circuit is used for the purpose of reducing power consumption. In the above-described level shifter circuit, a shoot-through current flows through TFTs 601 and 602 between VSS and VDD2 when TFT 602 is ON. The two-input-type inverter is used to prevent the shoot-through current from flowing during operation.

In the inverter circuits in Stage 2 shown in FIG. 6A, the signal supplied to the gate electrode of TFT 611 and the signal supplied to the gate electrode of TFT 612 are opposite in polarity to each other. Therefore, by utilizing the forms of CK1 and CK3 opposite in polarity to each other, the output signal appearing at node α and the output signal appearing at node β are used as an input and an inverted input to the TFTs.

The operation of the inverter circuits will be described. The operation of one of the two inverter circuits in Stage 2, i.e., the inverter circuit formed of TFTs 611 to 614 and capacitor 615, will be described. The other inverter circuit operates in the same manner.

When the signal supplied to the gate electrode of TFT 611 is high level, TFT 611 is ON and the potential at the gate electrode of TFT 613 is pulled up toward VDD2. When the potential becomes equal to (VDD2−V thN), TFT 611 is turned off and the gate electrode of TFT 613 is floated. On the other hand, since the signal supplied to the gate electrodes of TFTs 612 and 614 is low level, each of TFTs 612 and 614 is OFF. Since the potential at the gate electrode of TFT 613 has been pulled up to (VDD2−V thN), TFT 613 is ON and the potential at node γ is pulled up toward VDD2. As in the operation of the above-described level shifter circuit, with the increase in the potential at node γ, the potential at the gate electrode of TFT 613 in the floating state is pulled up by the function of the capacitor 615 to a level higher than VDD2. The potential at the gate electrode of TFT 613 is thus set above (VDD2+V thN), so that the high level appearing at node γ becomes equal to VDD2.

When the signal supplied to the gate electrode of TFT 611 is low level, TFT 611 is OFF, high level is supplied to the gate electrodes of TFTs 612 and 614, and each of TFTs 612 and 614 is ON. Consequently, the potential at the gate electrode of TFT 613 is low level and the low level appears at node γ.

A pulse is also output to node δ by the same operation. The pulse output through node δ is opposite in polarity to the pulse appearing at node γ.

The same operation is performed in each of Stages 3 and 4 to finally output pulses to signal output sections (3) and (4).

Figure 6B:
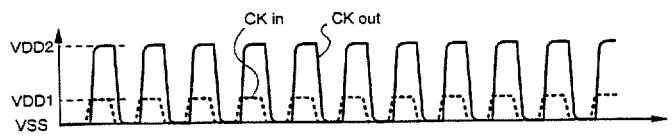

FIG. 6B shows a state of clock signal amplitude conversion. The amplitude of the input signal is low level/high level=VSS/VDD1 (0 V/5 V) and the amplitude of the output signal is low level/high level=VSS/VDD2 (0 V/16 V).

Figure 6C:
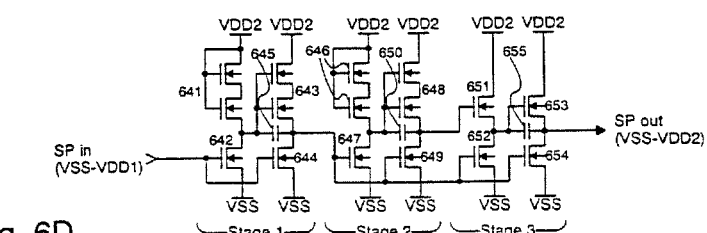

FIG. 6C illustrates the start pulse (SP) level shifter. The start pulse is used without an inverted signal of it. Therefore, an output from a one-input-type level shifter circuit (Stage 1) is input to a one-input-type inverter circuit (Stage 2). Outputs from Stage 1 and Stage 2 are used in a two-input-type inverter circuit (Stage 3). The operation of the one-input-type level shifter circuit is the same as that in the case of processing the clock signal. The one-input-type inverter circuit operates in the same manner as the one-input-type level shifter circuit with respect to processing therein except that the amplitude of the input signal is low level/high level=VSS/VDD2 and no amplitude conversion is performed between input and output pulses. The description for these circuits will not be repeated.

Figure 6D:

FIG. 6D shows a state of start pulse amplitude conversion. The amplitude of the input signal is low level/high level=VSS/VDD1 (0 V/5 V) and the amplitude of the output signal is low level/high level=VSS/VDD2 (0 V/16 V), as are those of the clock signal.

Figure 7A:
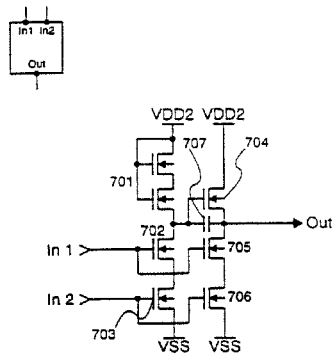
FIGS. 7A, 7B, and 7C are diagrams showing details of circuit structures of a NAND circuit, a buffer circuit and a sampling switch in the display device provided in accordance with the present invention.

FIG. 7A illustrates the two-input-type NAND circuit. The structure of the NAND circuit is similar to that of the one-input-type inverter circuit. The difference resides only in that a two-input signal input section is provided in place of that in the one-input inverter circuit, TFTs 702 and 703 are provided in series with each other, and TFTs 705 and 706 are also provided in series with each other.

When high level is input to each of signal input sections (In1) and (In2), each of TFTs 702, 703, 705, and 706, is turned on, the potential at the gate electrode of TFT 704 becomes low level, and TFT 704 is thus turned off. As a result, low level appears at a signal output section (Out). When low level is input to both or one of the signal input sections (In1) and (In2), conduction is not provided between the gate electrode of TFT 704 and power supply VSS and the potential at the gate electrode of TFT 704 is therefore pulled up toward VDD2 to turn on TFT 704. Further, the potential is increased to a level higher than (VDD+V thN) by the function of capacitor 707, so that high level corresponding to potential VDD2 appears at the signal output section (Out).

Figure 7B:
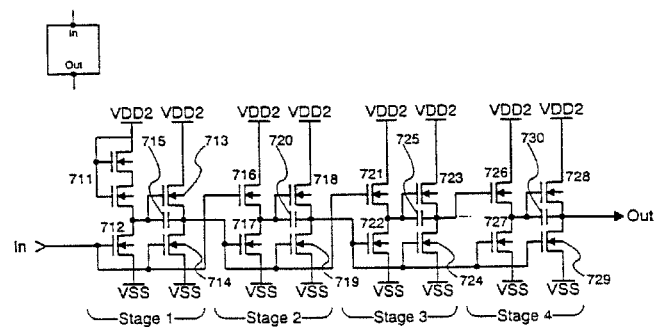

FIG. 7B shows the structure of the buffer circuit constituted by a one-input-type inverter circuit (Stage 1) and two-input-type inverter circuits (Stages 2 to 4). The operation of each of one-input-type and two-input-type inverter circuits is the same as that in the level shifter described above. The description for it will not be repeated.

Figure 7C:
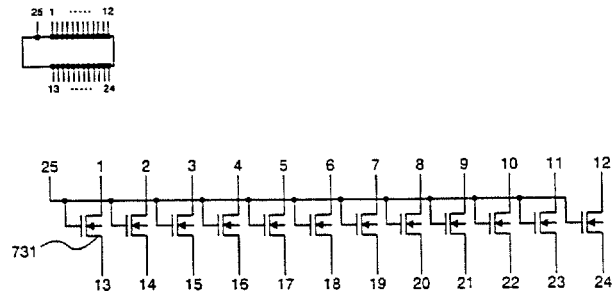

FIG. 7C shows the structure of the sampling switch. A sampling pulse is input through a signal input section (25) to simultaneously control twelve TFTs 731 arranged in parallel with each other. Analog video signals are supplied to input electrodes (1) to (12) of the twelve TFTs 731 to write the potentials of the video signals to the source signal lines when a sampling pulse is input.

The inverter circuit and the level shifter circuit in the circuits constituting the driver circuits of the display device of this embodiment may be the same as those described in the specification of the invention filed in Japanese Patent Application No. 2001-133431 by the inventors of the present application.

The driver circuits constituting the entire display device including the pixel portion in this embodiment are fabricated by using only TFTs (e.g., n-channel TFTs) of one polarity which is the same as the polarity of the pixel TFTs. Therefore, the ion doping process for imparting p-type conductivity to a semiconductor layer can be removed. This contributes to a reduction in manufacturing cost and to an improvement in yield.

While the TFTs constituting the display device of this embodiment are n-channel TFTs, driver circuits and pixel TFTs may be formed by using only p-channel TFTs according to the present invention. In such a case, the ion doping process to be removed is a process for imparting n-type conductivity to a semiconductor layer. Also, the present invention is applied not only to liquid crystal display devices but also to any of semiconductor devices if the semiconductor device is fabricated by integrally forming a driver circuit on an insulator.

Embodiment 3

In the embodiment mode of the present invention and the above embodiments of the present invention, examples of the circuits formed by using only n-channel TFTs have been shown. However, similar circuits may be formed by using only p-channel TFTs and by interchanging the power supply-potential levels.

Figure 13A:
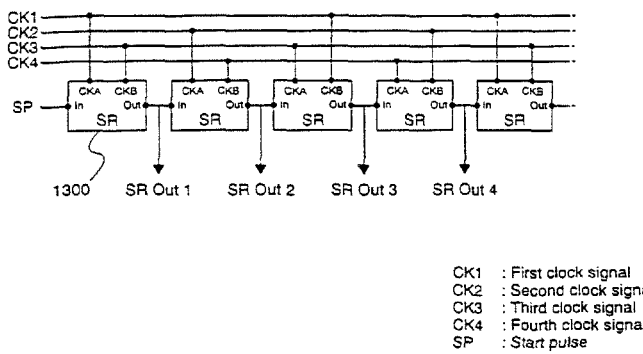
FIGS. 13A and 13B are diagrams showing a shift register formed by using a pulse output circuit constituted of transistors of a conductivity type different from that in embodiment mode of the present invention.
Figure 13B:
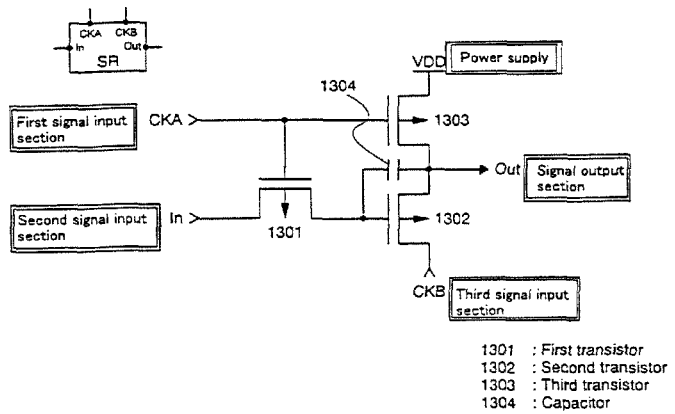

FIGS. 13A and 13B illustrate an example of a shift register formed by using only p-channel TFTs. The structure shown in the block diagram of FIG. 13A is the same as that of the shift register shown in FIGS. 1A and 1B, which is formed by using only n-channel TFTs. A block 1300 in FIG. 13A represents a pulse output circuit forming one stage for outputting a sampling pulse. The shift register shown in FIG. 13A differs from the shift register formed by using only n-channel TFTs in that the levels of the power supply potentials are reversed as shown in FIG. 13B.

Figure 14:
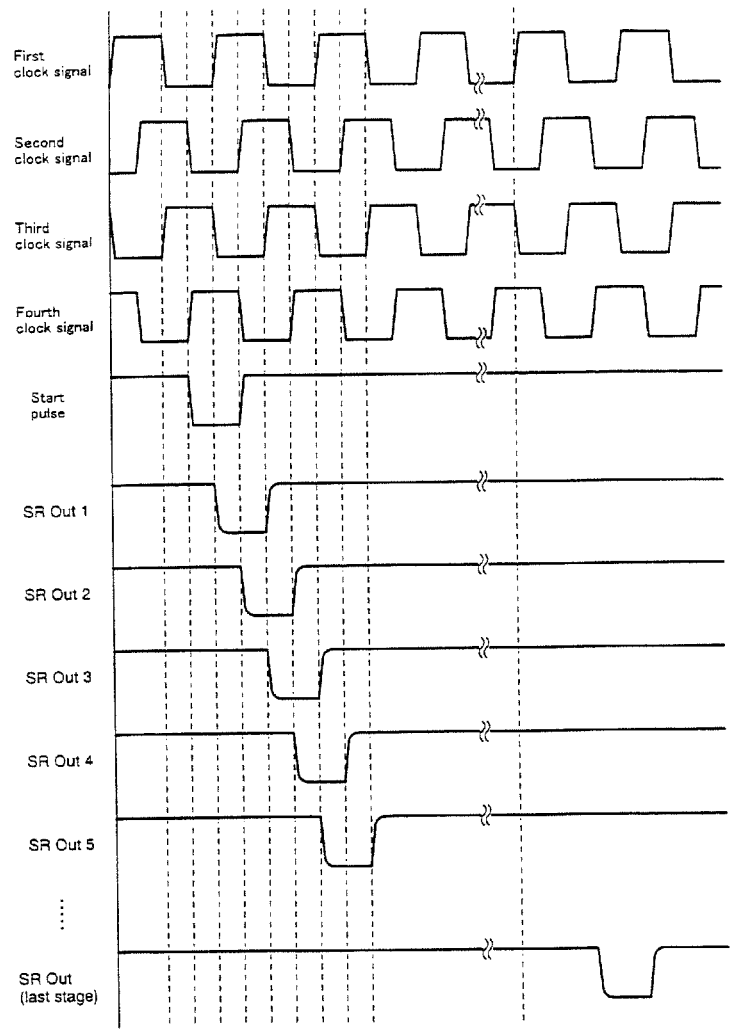
FIG. 14 is a timing chart relating to drive of the shift register shown in FIGS. 13A and 13B.

FIG. 14 shows a timing chart and output pulses. The operation of each section is the same as that in the embodiment mode described above with reference to FIGS. 1 and 2. Therefore detailed description for it will not be repeated. The pulses shown in FIG. 14 are expressed by reversing the high and low levels shown in FIG. 2.

Embodiment 4

Figure 15:
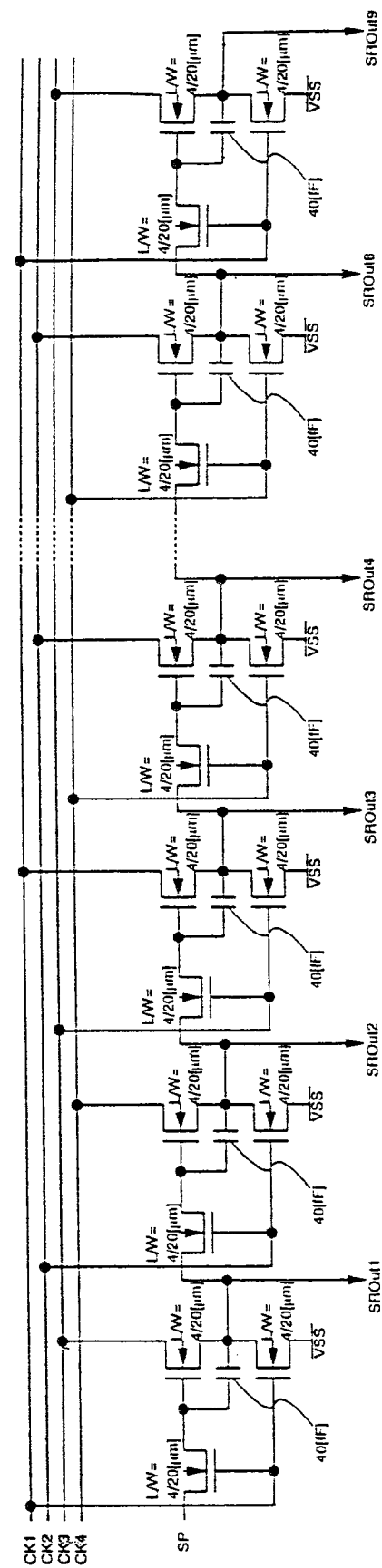
FIG. 15 is a diagram showing a TFT size and a capacitance value in a test piece of a fabricated shift register.

A test piece of a shift register shown in FIG. 15 is fabricated in accordance with the present invention. The shift register is formed to have nine pulse output circuit stages. The channel length/channel width and the capacitance value of each TFT are shown in FIG. 15.

Figure 16:
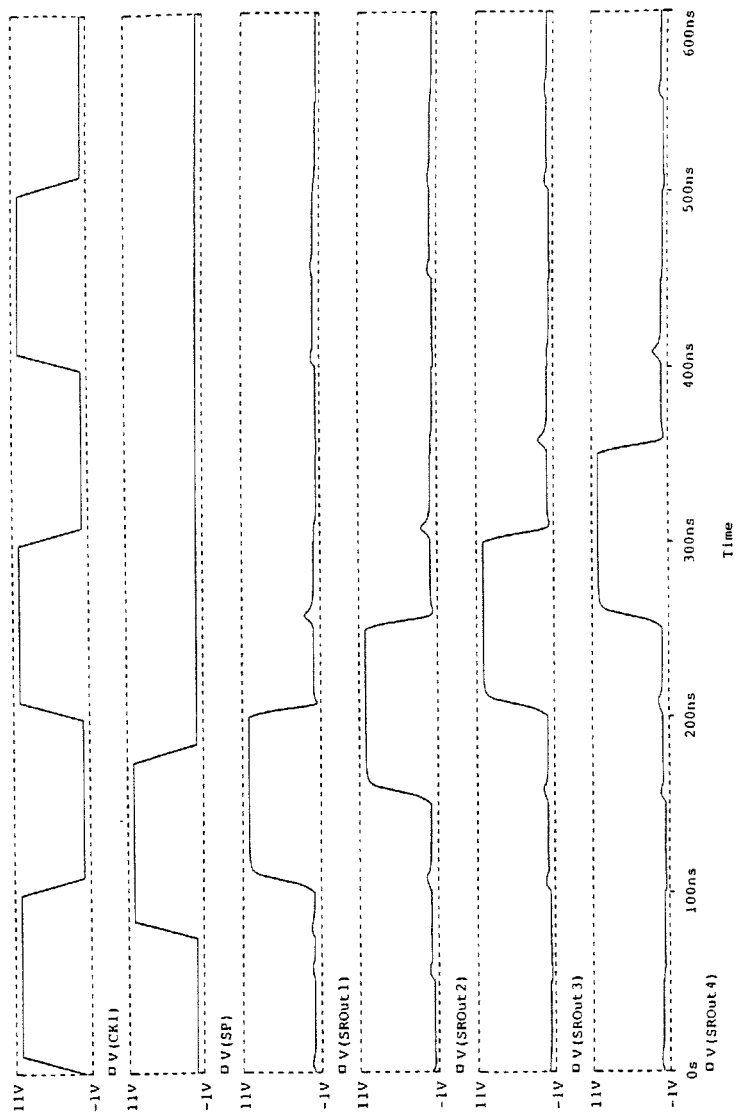
FIG. 16 is a diagram showing the results of simulation of the shift register shown in FIG. 15.

FIG. 16 shows the results of simulation of this shift register circuit. As operating conditions, the input signal amplitude is set to low level/high level=0 V/10 V and the power supply potentials of the circuit are also set to the same values. In FIG. 16, first clock signal (CK1), start pulse (SP), shift register first stage output (SROut1), shift register second stage output (SROut2), shift register third stage output (SROut3), and shift register fourth stage output (SROut4) are shown in the top to bottom sections of the graph.

Figure 17A:
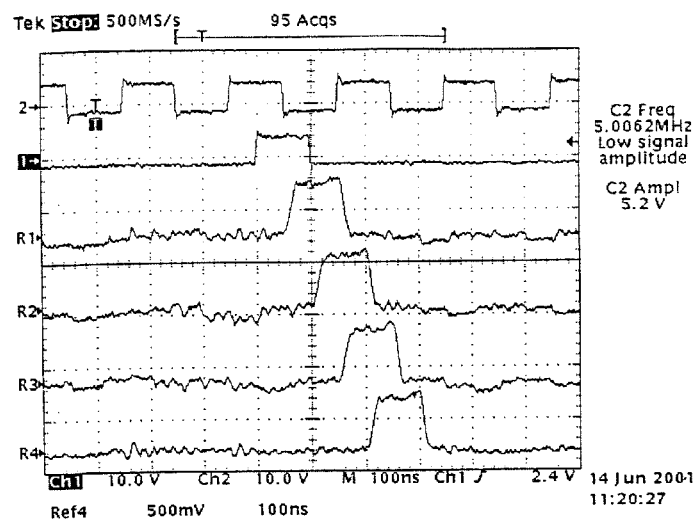
FIGS. 17A and 17B are diagrams showing the results of measurements of the shift register actually fabricated as shown in FIG. 15.
Figure 17B:
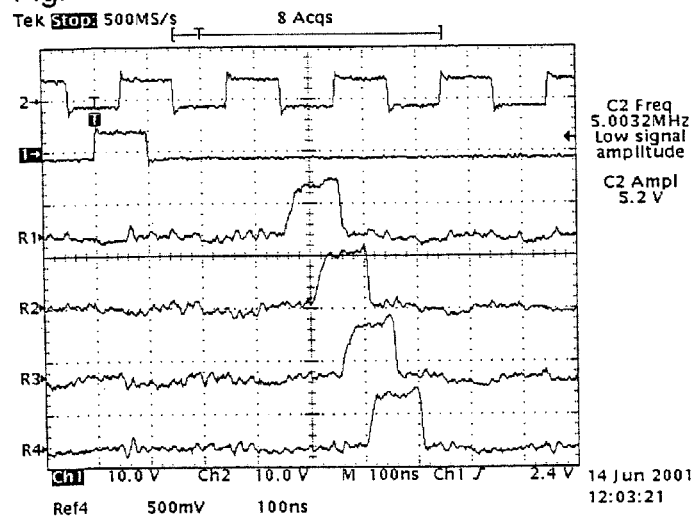

FIGS. 17A and 17B show the results of an operation test of the test piece of the shift register actually fabricated. In FIG. 17A, first clock signal (CK1), start pulse (SP), shift register first stage output (SROut1), shift register second stage output (SROut2), shift register third stage output (SROut3), and shift register fourth stage output (SROut4) are shown in the top to bottom sections of the graph. In FIG. 17B, first clock signal (CK1), start pulse (SP), shift register sixth stage output (SROut6), shift register seventh stage output (SROut7), shift register eighth stage output (SROut8), and shift register final stage output (SROut9) are shown in the top to bottom sections of the graph. As shown in FIGS. 17A and 17B, a normal operation at the power supply voltage 10V and at an driving frequency of about 5 MHz was confirmed.

Embodiment 5

The present invention can be applied to manufacture of display devices to be used in various electronic devices. Examples of such electronic devices are portable information terminals (an electronic notebook, a mobile computer, a portable telephone, etc.), a video camera, a digital camera, a personal computer, a television set, and a portable telephone, such as those illustrated in FIGS. 8A through 8G.

Figure 8A:
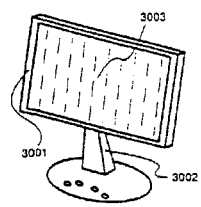
FIGS. 8A through 8G are diagrams showing examples of electronic devices to which the present invention can be applied.

FIG. 8A illustrates a liquid crystal display (LCD) constituted by a case 3001, a stand 3002, a display portion 3003, etc. The present invention can be applied to the display portion 3003.

Figure 8B:
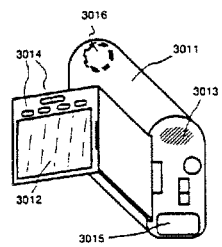

FIG. 8B illustrates a video camera constituted by a main body 3001, a display portion 3012, an audio input portion 3013, operating switches 3014, a battery 3015, an image receiving portion 3016, etc. The present invention can be applied to the display portion 3012.

Figure 8C:
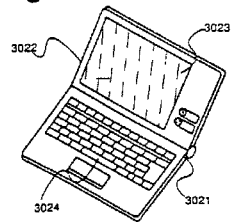

FIG. 8C illustrates a notebook-type personal computer constituted by a main body 3021, a case 3022, a display portion 3023, a keyboard 3024, etc. The present invention can be applied to the display portion 3023.

Figure 8D:
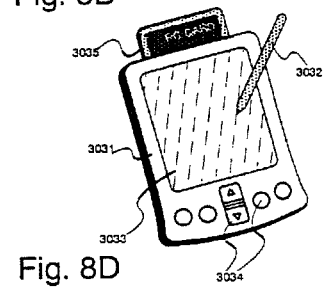

FIG. 8D illustrates a portable information terminal constituted by a main body 3031, a stylus 3032, a display portion 3033, operating buttons 3034, an external interface 3035, etc. The present invention can be applied to the display portion 3033.

Figure 8E:
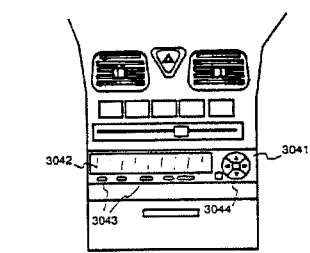

FIG. 8E illustrates an audio reproduction device, more specifically an audio device mounted in a motor vehicle and constituted by a main body 3041, a display portion 3042, operating switches 3043 and 3044, etc. The present invention can be applied to the display portion 3042. The invention may be applied to any of portable or home audio devices other than the above-described audio device mounted in a motor vehicle.

Figure 8F:
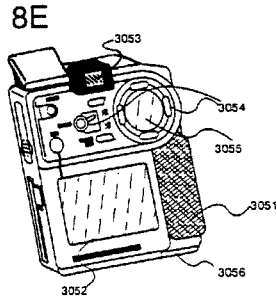

FIG. 8F illustrates a digital camera constituted by a main body 3051, a display portion (A) 3052, an ocular portion 3053, operating switches 3054, a display portion (B) 3055, a battery 3056, etc. The present invention can be applied to each of the display portion (A) 3052 and the display portion (B) 3055.

Figure 8G:
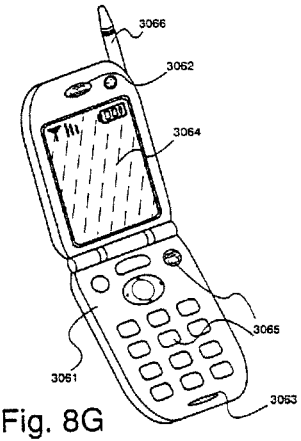
Figure 9A:
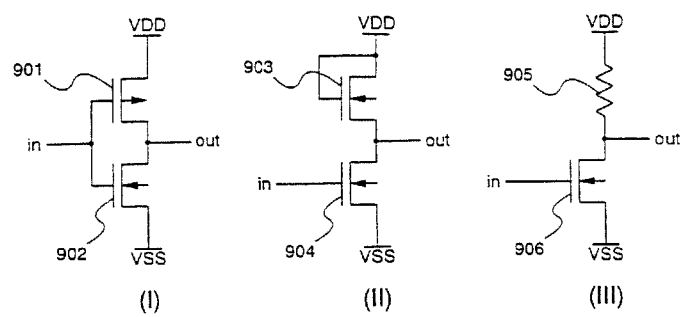
FIGS. 9A through 9E are diagrams showing structures of a conventional CMOS inverter and load-type inverters and the waveforms of input and output signals relating to the inverters.
Figure 9B:
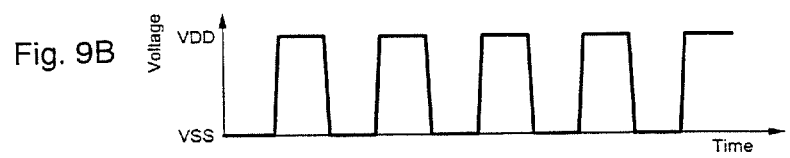
Figure 9C:
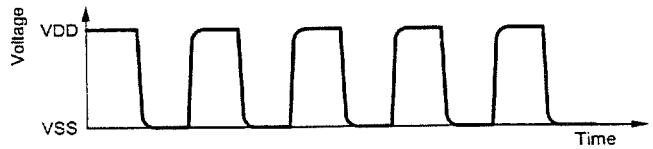
Figure 9D:
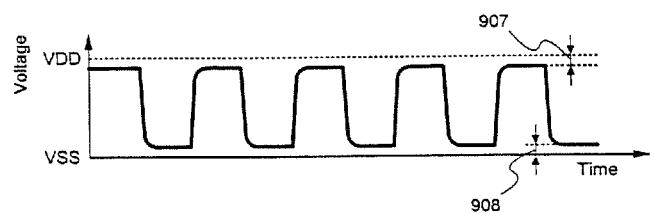
Figure 9E:
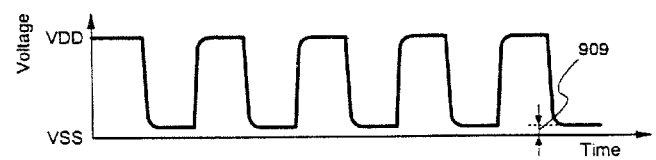
Figure 10A:
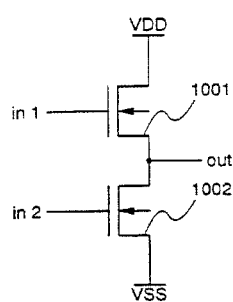
FIGS. 10A and 10B are diagrams for explaining the principle of the pulse output circuit of the present invention.
Figure 10B:
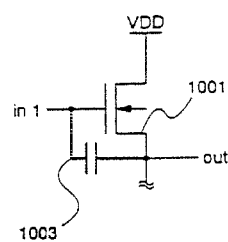
Figure 11A:
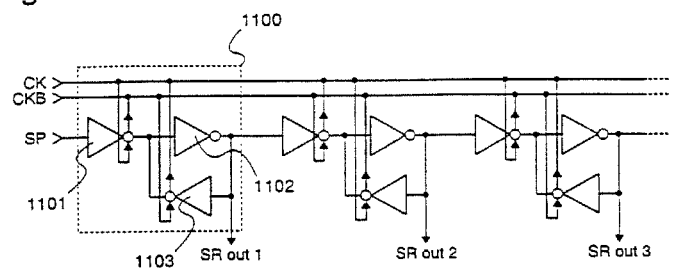
FIGS. 11A, 11B, and 11C are diagrams showing a circuit configuration of a conventional shift register and a timing chart.
Figure 11B:
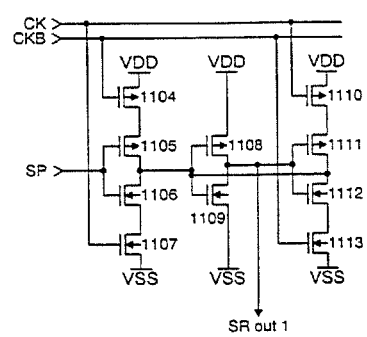
Figure 11C:
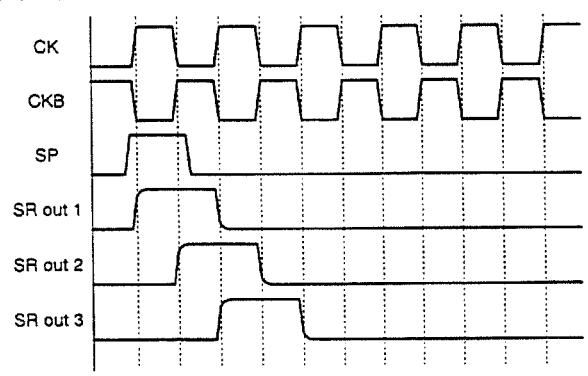

FIG. 8G illustrates a portable telephone constituted by a main body 3061, an audio output portion 3062, an audio input portion 3063, a display portion 3064, operating switches 3065, an antenna 3066, etc. The present invention can be applied to the display portion 3064.

It is to be noted that the above-described devices of this embodiment are only examples and that the invention is not exclusively applied to them.

According to the present invention, even in a case where a driver circuit and a pixel portion of a display device are formed by using only TFTs of one conductivity type, output pulses of a normal amplitude can be obtained without causing attenuation of the amplitude of the output pulses due to the threshold value of the TFTs. Thus, the number of manufacturing steps can be reduced and this effect contributes to a reduction in manufacturing cost and to an improvement in yield. Thus, the present invention makes it possible to supply display devices at a reduced cost.

What is claimed is:

1. A shift register comprising:
a plurality of pulse output circuit stages, each of the plurality of pulse output circuit stages comprising:
first, second and third transistors, each having a gate electrode, a first electrode and a second electrode, wherein the second electrode of the first transistor is electrically connected to the gate electrode of the second transistor, and wherein the gate electrode of the first transistor is directly connected to the gate electrode of the third transistor;
a capacitor having a first terminal and a second terminal, wherein the first terminal is directly connected to the gate electrode of the second transistor, and wherein the second terminal is directly connected to the second electrode of the second transistor;
a first signal input portion electrically connected to the first electrode of the second transistor;
a power supply electrically connected to the first electrode of the third transistor; and
a signal output portion directly connected to the second electrodes of the second and third transistors,
wherein the first, second and third transistors are the same conductivity type, and
wherein electric potential of the gate electrode of the first transistor and electric potential of the gate electrode of the third transistor are controlled by a first clock signal.

2. A shift register according to claim 1, wherein the conductivity type is an n-channel type.

3. A shift register according to claim 1, wherein the conductivity type is a p-channel type.

4. A shift register according to claim 1, wherein the signal output portion in n-th pulse output circuit stage is electrically connected to the first electrode of the first transistor in (n+1)-th pulse output circuit stage.

5. A shift register according to claim 1, wherein a second clock signal is input to the first signal input portion.

6. A shift register according to claim 1, wherein the shift register is applied to an electronic device selected from the group consisting of a liquid crystal display device, a video camera, a notebook-type personal computer, a portable information terminal, an audio reproduction device, a digital camera and a portable telephone.

7. A shift register according to claim 1, wherein each of the first, second and third transistors has a channel length and a channel width, with the channel length being shorter than the channel width.

8. A display device comprising:
a pixel portion over a substrate;
a driver circuit over the substrate, the driver circuit comprising:
a plurality of pulse output circuit stages, each of the plurality of pulse output circuit stages comprising:
first, second and third transistors, each having a gate electrode, a first electrode and a second electrode, wherein the second electrode of the first transistor is electrically connected to the gate electrode of the second transistor, and wherein the gate electrode of the first transistor is directly connected to the gate electrode of the third transistor;
a capacitor having a first terminal and a second terminal, wherein the first terminal is directly connected to the gate electrode of the second transistor, and wherein the second terminal is directly connected to the second electrode of the second transistor;
a first signal input portion electrically connected to the first electrode of the second transistor;
a power supply electrically connected to the first electrode of the third transistor; and
a signal output portion directly connected to the second electrodes of the second and third transistors,
wherein the first, second and third transistors are the same conductivity type, and
wherein electric potential of the gate electrode of the first transistor and electric potential of the gate electrode of the third transistor are controlled by a first clock signal, wherein electric potential of the gate electrode of the second transistor is not controlled by the first clock signal.

9. A display device according to claim 8, wherein the conductivity type is an n-channel type.

10. A display device according to claim 8, wherein the conductivity type is a p-channel type.

11. A display device according to claim 8, wherein the signal output portion in n-th pulse output circuit stage is electrically connected to the first electrode of the first transistor in (n+1)-th pulse output circuit stage.

12. A display device according to claim 8, wherein a second clock signal is input to the first signal input portion.

13. A display device according to claim 8, wherein the display device is applied to an electronic device selected from the group consisting of a liquid crystal display device, a video camera, a notebook-type personal computer, a portable information terminal, an audio reproduction device, a digital camera and a portable telephone.

14. A display device according to claim 8, wherein each of the first, second and third transistors has a channel length and a channel width, with the channel length being shorter than the channel width.

15. A shift register according to claim 1, wherein a second signal input portion is electrically connected to the first electrode of the first transistor.

16. A display device according to claim 8, wherein a second signal input portion is electrically connected to the first electrode of the first transistor.

* * * * *

UNITED STATES PATENT AND TRADEMARK OFFICE
CERTIFICATE OF CORRECTION

| | |
|---|---|
| PATENT NO. | : 9,024,930 B2 |
| APPLICATION NO. | : 11/968801 |
| DATED | : May 5, 2015 |
| INVENTOR(S) | : Shou Nagao et al. |

It is certified that error appears in the above-identified patent and that said Letters Patent is hereby corrected as shown below:

In the specification,
Column 5, line 43, after "type" replace ":" with --;--; and In the claims,
Column 18, line 25, in claim 8, delete ", wherein electric potential of the gate electrode of the second transistor is not controlled by the first clock signal".

Page 1 of 1

Signed and Sealed this
Ninth Day of February, 2016

Michelle K. Lee
*Director of the United States Patent and Trademark Office*